(12) United States Patent
Kim

(10) Patent No.: US 8,742,548 B2
(45) Date of Patent: Jun. 3, 2014

(54) SEMICONDUCTOR DEVICE WITH ONE-SIDE CONTACT AND FABRICATION METHOD THEREOF

(75) Inventor: You-Song Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 276 days.

(21) Appl. No.: 12/980,779

(22) Filed: Dec. 29, 2010

(65) Prior Publication Data

US 2012/0007218 A1    Jan. 12, 2012

(30) Foreign Application Priority Data

Jul. 6, 2010 (KR) .................... 10-2010-0064897

(51) Int. Cl.
*H01L 23/48* (2006.01)
(52) U.S. Cl.
USPC ............ 257/621; 257/E21.657; 257/E21.658; 438/424; 438/427; 438/430; 438/435
(58) Field of Classification Search
USPC ......... 257/296, 306, 308, 374, 397, 510, 516, 257/532, E21.545, E21.546, E27.044, 257/E27.048, E27.071, E27.088, E21.657, 257/E21.658; 438/210, 239, 250, 253, 393, 438/396, 424, 427, 700, 761, 778, 435
See application file for complete search history.

(56) References Cited

U.S. PATENT DOCUMENTS

| | | | | |
|---|---|---|---|---|
| 6,348,374 | B1* | 2/2002 | Athavale et al. | 438/243 |
| 7,368,365 | B2* | 5/2008 | Wells | 438/424 |
| 2003/0034512 | A1* | 2/2003 | Cappelani et al. | 257/301 |
| 2011/0129975 | A1* | 6/2011 | Lee | 438/270 |

FOREIGN PATENT DOCUMENTS

| | | |
|---|---|---|
| KR | 100147584 | 8/1998 |
| KR | 1020100074649 | 7/2010 |

OTHER PUBLICATIONS

Notice of Preliminary Rejection issued from Korean Intellectual Property Office on Oct. 6, 2011.

* cited by examiner

*Primary Examiner* — Ermias Woldegeorgis
(74) *Attorney, Agent, or Firm* — IP & T Group LLP

(57) ABSTRACT

A method for fabricating a semiconductor device includes forming a plurality of first trenches by etching a substrate, forming first spacers covering both sidewalls of each of the first trenches, forming a plurality of second trenches by etching a bottom of each of the first trenches, forming second spacers covering both sidewalls of each of the second trenches, forming a plurality of third trenches by etching a bottom of each of the second trenches, forming an insulation layer covering exposed surfaces of the plurality of the substrate, and forming a contact which exposes one sidewall of each of the second trenches by selectively removing the second spacers.

14 Claims, 9 Drawing Sheets

SEMICONDUCTOR DEVICE WITH ONE-SIDE CONTACT AND FABRICATION METHOD THEREOF

CROSS-REFERENCE TO RELATED APPLICATIONS

The present application claims priority of Korean Patent Application No. 10-2010-0064897, filed on Jul. 6, 2010, which is incorporated herein by reference in its entirety.

BACKGROUND OF THE INVENTION

Exemplary embodiments of the present invention relate to a method for fabricating a semiconductor device, and more particularly, to a semiconductor device having a One-Side-Contact (OSC) structure and a method for fabricating the same.

When buried bit lines (BBL) are used in cells of a vertical gate (VG), two cells are adjacent to one buried bit line. In order for only one cell to be driven by the one buried bit line, a one-side contact is formed in the active region of one cell so that only that cell is driven and the adjacent cell is insulated. Herein, a one-side contact refers to a portion along one sidewall of an active region that permits electrical contact between the active region and its corresponding bit line.

The height of the buried bit lines is often short, and therefore, it can be difficult to form the one-side contact in a portion of a sidewall of an active region so that the active region and a buried bit line are coupled.

FIGS. 1A to 1C are cross-sectional views illustrating a conventional method for fabricating a semiconductor device.

Referring to FIG. 1A, a hard mask pattern 12 is formed over a semiconductor substrate 11.

Subsequently, a plurality of trenches 13 are formed by using the hard mask pattern 12 as an etch barrier and etching the semiconductor substrate 11 to a certain depth. The plurality of the trenches 13 define a plurality of active regions 101 that are separated from each other by the trenches 13.

Subsequently, a first insulation layer 14 and a second insulation layer 15 are sequentially formed. Then, a polysilicon layer 16 gap-filling the plurality of the trenches 13 is formed.

Referring to FIG. 1B, the polysilicon layer 16 is planarized through a Chemical Mechanical Polishing (CMP) method until the surface of the hard mask pattern 12 is exposed. Then, an etch-back process is performed to recess the planarized polysilicon layer 16 using the hard mask pattern 12 as an etch barrier. As a result, recessed polysilicon layers 16A and 16B are formed. As shown in FIG. 1B, the recessed polysilicon layers 16A and 16B may have different heights.

Referring to FIG. 1C, the recessed polysilicon layers 16A and 16B are etched using an OSC mask (not shown). As a result, recesses R1 and R2 are created to form openings used to subsequently form one-side contacts.

The conventional technology, however, cannot exactly control the height of the recessed polysilicon layers 16A and 16B resulting from the etch-back process due to the presence of a seam or void 17 which is caused when the polysilicon layer 16 is gap-filled. Also, since horns 18 may be formed in the plurality of the trenches 13 of approximately 3000 Å or higher, it is difficult to form the one-side contact at a desired position. Moreover, the depth of the recesses R1 and R2 may not be uniform due to the presence of the seam or void 17.

SUMMARY OF THE INVENTION

Exemplary embodiments of the present invention are directed to a semiconductor device that may improve reproducibility of a one-side contact, and a fabrication method thereof.

In accordance with an exemplary embodiment of the present invention, a method for fabricating a semiconductor device includes: forming a plurality of first trenches by etching a substrate, forming first spacers covering both sidewalls of each of the first trenches, forming a plurality of second trenches by etching a bottom of each of the first trenches, forming second spacers covering both sidewalls of each of the second trenches, forming a plurality of third trenches by etching a bottom of each of the second trenches, forming an insulation layer covering exposed surfaces of the substrate, and forming a contact which exposes one sidewall of each of the second trenches by selectively removing the second spacers.

The forming of the third trenches may include forming a barrier layer on the bottom surfaces of the second trenches, forming third spacers along both sidewalls of each of the second trenches to cover the second spacers, removing one of the third spacers in each of the second trenches, and forming the third trenches by etching the bottom surfaces of the second trenches using the remaining second and third spacers as etch barriers.

In accordance with another exemplary embodiment of the present invention, a semiconductor device includes a plurality of triple trenches each including a first trench, a second trench, and a third trench that are formed in a substrate and extend in a depth direction with different widths, an insulation layer providing a one-side contact, which exposes one sidewall in each of the second trenches, and covering the remaining surfaces of the triple trenches, a plurality of junctions formed on the sidewalls of the second trenches which are exposed through the one-side contacts. The semiconductor device may further include a plurality of buried bit lines coupled with the junctions and filling a portion of each of the triple trenches.

In accordance with yet another exemplary embodiment of the present invention, a semiconductor device includes a substrate having a trench formed therein to define two active regions, two first spacers, one on an upper portion of each sidewall of the trench, a second spacer covering one of the first spacers and covering a middle portion of one of the sidewalls of the trench, an insulation layer covering the lower portion of the trench, and a one-side contact formed at a middle portion of one of the sidewalls of the trench.

DESCRIPTION OF SPECIFIC EMBODIMENTS

Figure 1A:
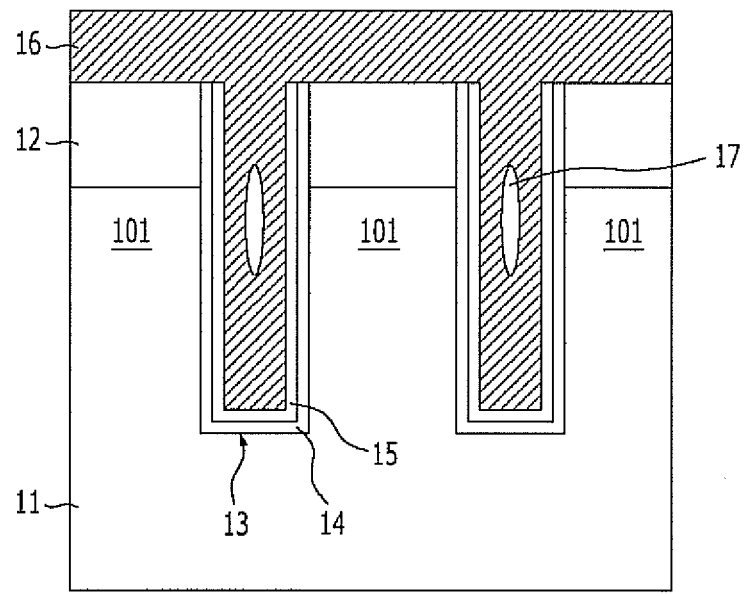
FIGS. 1A to 1C are cross-sectional views illustrating a conventional method for fabricating a semiconductor device.
Figure 1B:
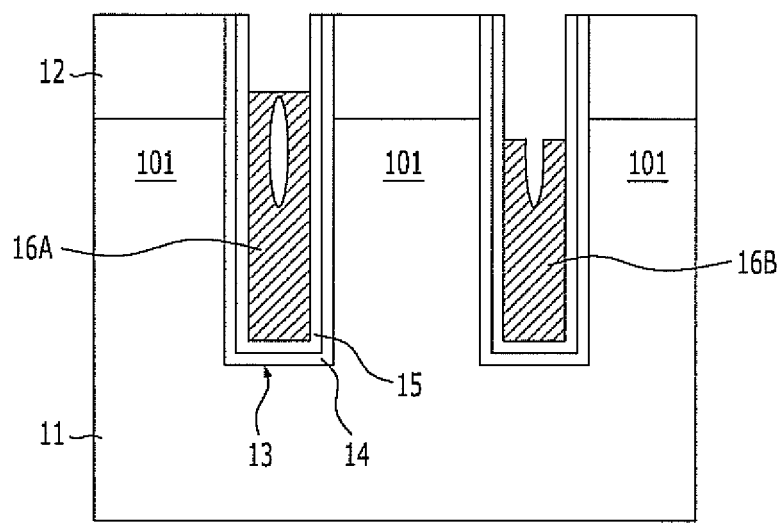
Figure 1C:
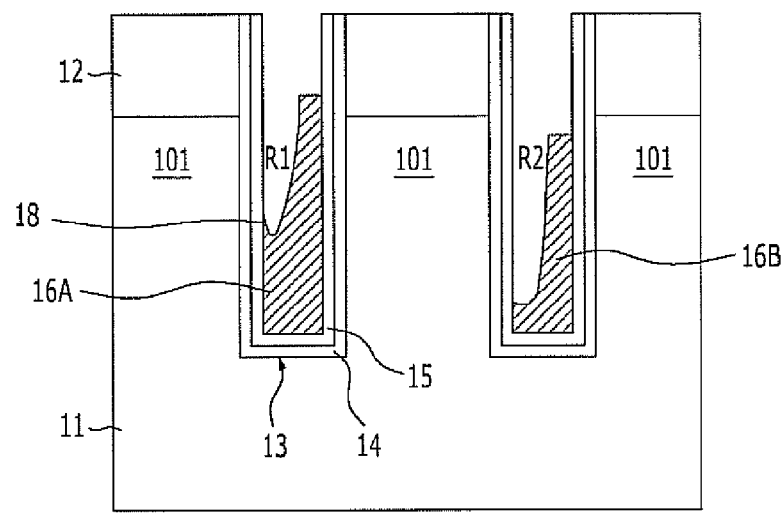

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 2A:
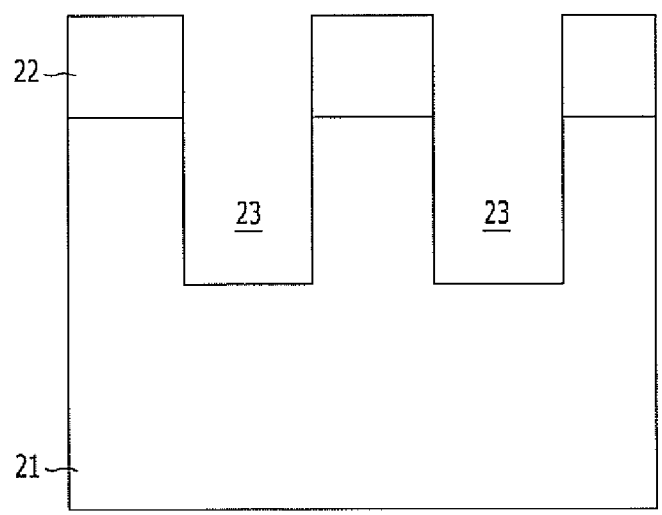
FIGS. 2A to 2N are cross-sectional views illustrating a method for fabricating a semiconductor device in accordance with an exemplary embodiment of the present invention.
Figure 2B:
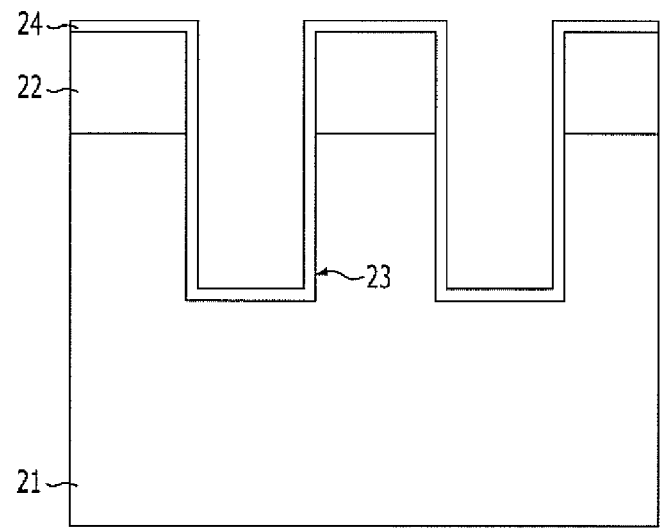
Figure 2C:
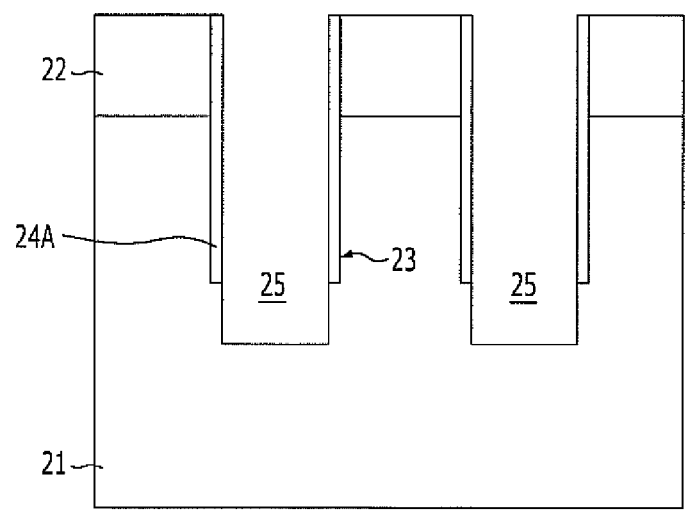
Figure 2D:
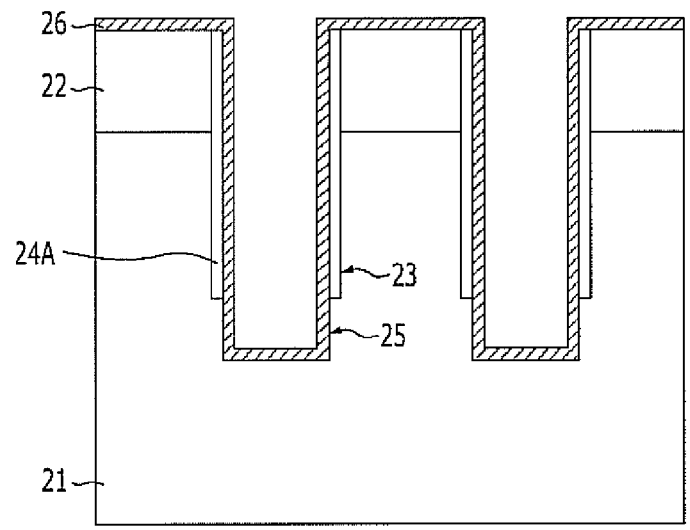
Figure 2E:
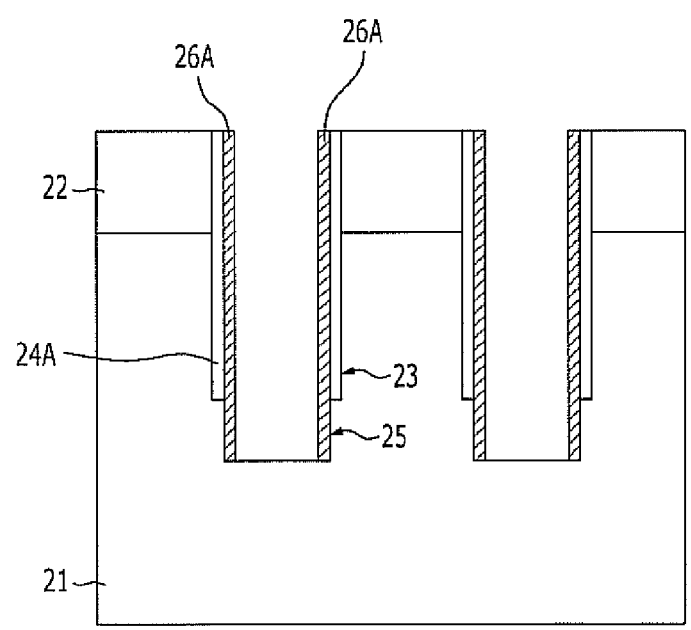
Figure 2F:
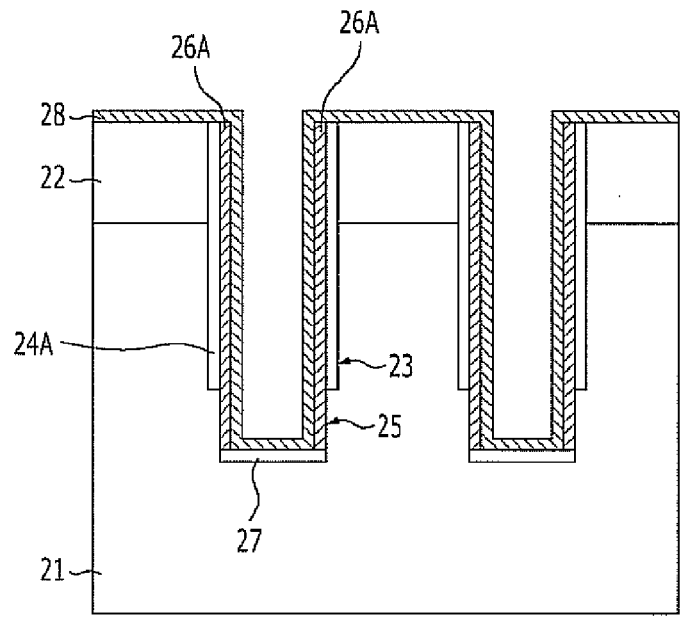
Figure 2G:
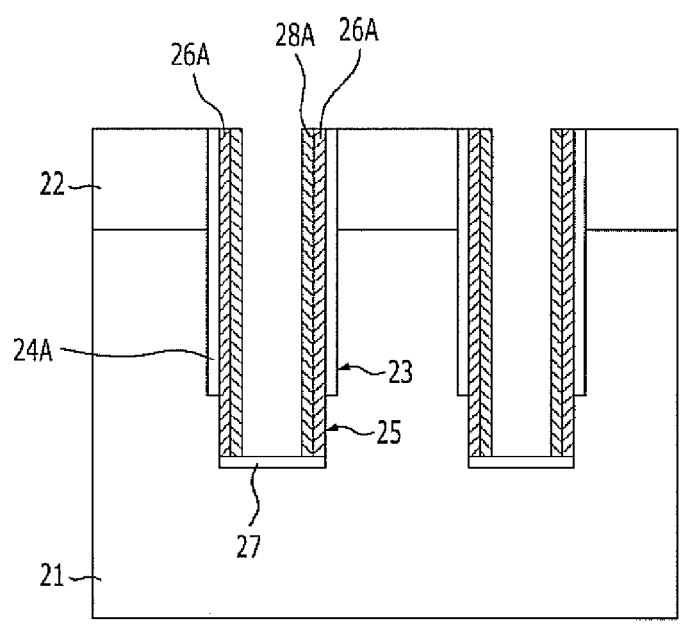
Figure 2H:
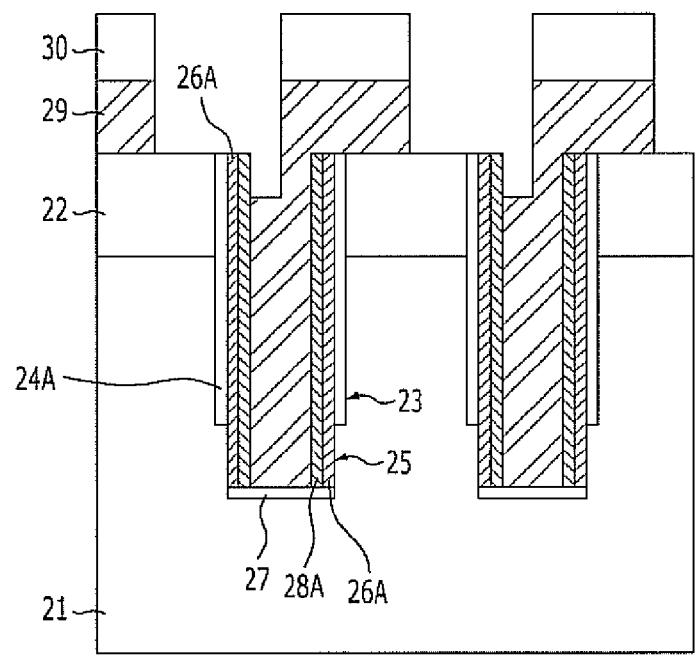
Figure 2I:
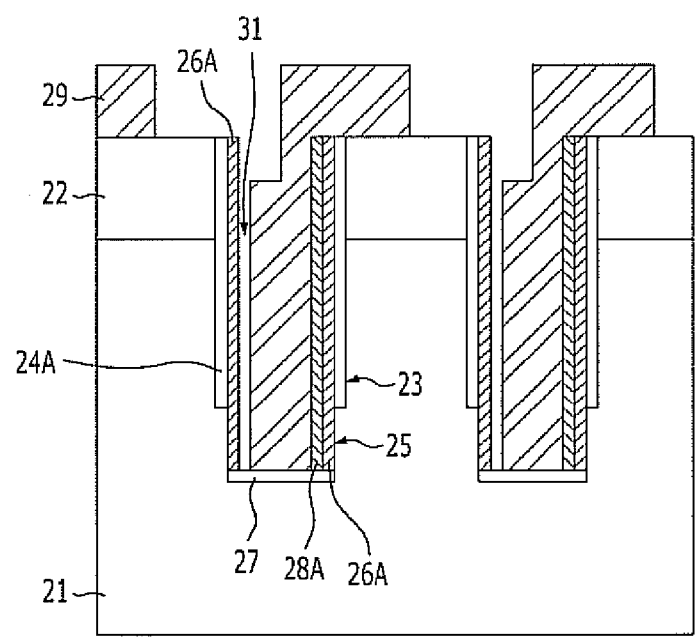
Figure 2J:
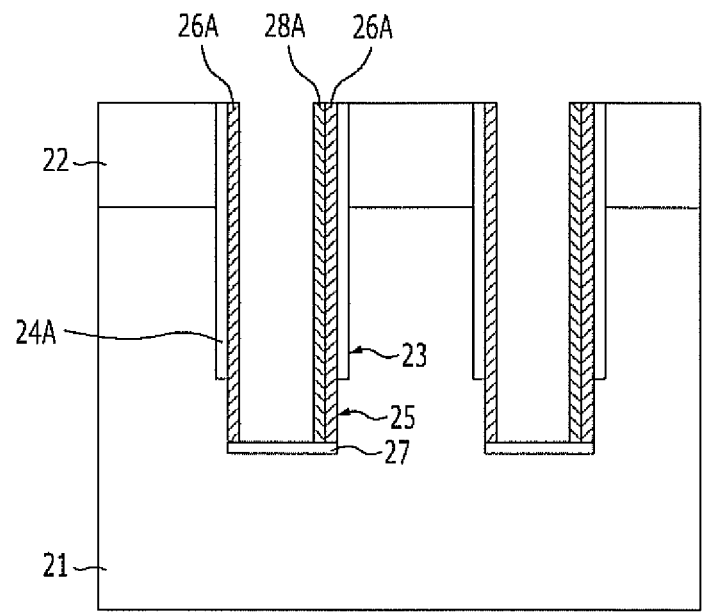
Figure 2K:
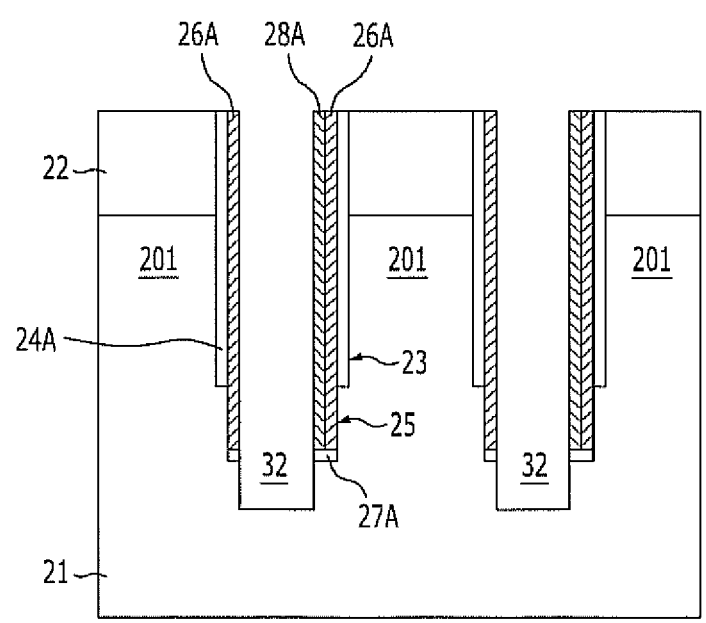
Figure 2L:
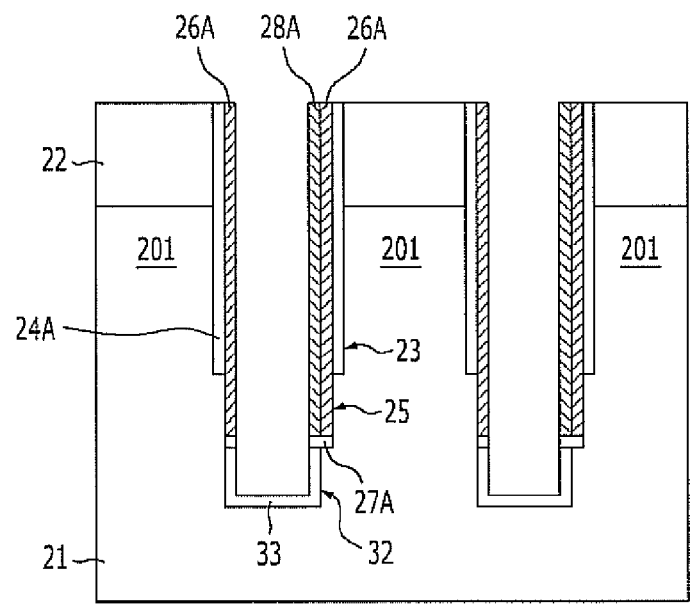
Figure 2M:
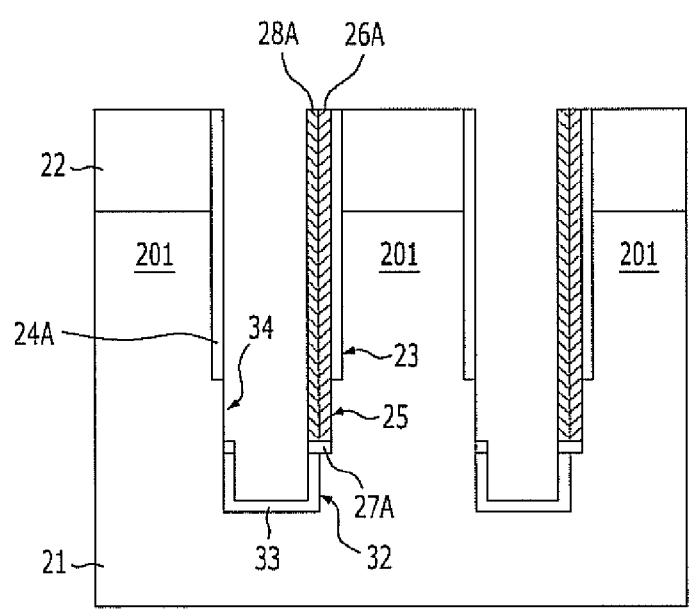
Figure 2N:
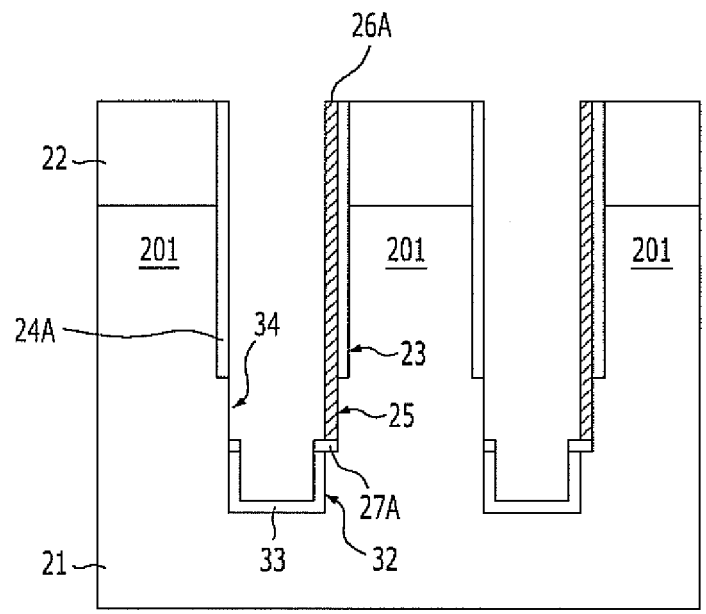

FIGS. 2A to 2N are cross-sectional views illustrating a method for fabricating a semiconductor device in accordance with an exemplary embodiment of the present invention.

Referring to FIG. 2A, a hard mask pattern 22 is formed over a semiconductor substrate 21. Here, the semiconductor substrate 21 may include a silicon substrate. The hard mask pattern 22 may be an oxide layer, a nitride layer, or a stacked layer of an oxide layer and a nitride layer. For example, the hard mask pattern 22 may include a hard mask nitride layer and a hard mask oxide layer sequentially stacked. The hard mask pattern 22 is patterned in a line-space type pattern. In a line-space type pattern, parallel lines of the hard mask material are separated by spaces.

Subsequently, a first trench etch process is performed using the hard mask pattern 22 as an etch barrier. In other words, a plurality of first trenches 23 are formed in the semiconductor substrate 21 by using the hard mask pattern 22 as an etch barrier and etching the semiconductor substrate 21 to a certain depth.

The first trench etch process is also referred to as a buried bit line (BBL) trench etch process.

Since the plurality of the first trenches 23 are formed using the hard mask pattern 22, they are patterned to have a line-space type pattern. That is, as a result of the first trench etch process, the plurality of the first trenches 23 form line shaped openings within the semiconductor substrate 21.

The first trench etch process may include an anisotropic etch process. When the semiconductor substrate 21 is a silicon substrate, the anisotropic etch process may be performed using a mixed gas of chlorine-based gas such as $CCl_4$ or $Cl_2$, bromide-based gas such as HBr, and oxygen gas.

Referring to FIG. 2B, a first insulation layer 24 is formed. The first insulation layer 24 includes an oxide layer, such as a silicon oxide layer. The oxide layer that is used as the first insulation layer 24 may be formed through a sidewall oxidation process which is performed onto the semiconductor substrate 21 having the plurality of the first trenches 23 formed therein.

Referring to FIG. 2C, a second trench etch process is performed to form a plurality of second trenches 25. The second trench etch process further etches the semiconductor substrate 21 at the bottom of the plurality of the first trenches 23 after the first insulation layer 24 is formed. Herein, portions of the first insulation layer 24 that are on the top surface of the hard mask pattern 22 and on the bottom surfaces of the first trenches 23 are etched. The remaining portions of the first insulation layer 24 that are on the sidewalls of each of the first trenches 23 form first spacers 24A. The amount of the semiconductor substrate 21 that is etched may be less in the second trench etch process than in the first trench etch process. In other words, the difference in depth between the second trenches 25 and the first trenches 23 is relatively small. The difference in depth between the first trenches 23 and the second trenches 25 defines the size of the one-side contact subsequently formed. Therefore, the depth of the second trenches 25 is controlled to open the portion where the one-side contact is to be formed. The second trench etch process may include an anisotropic etch process. When the semiconductor substrate 21 is a silicon substrate, the anisotropic etch process may be performed using a mixed gas of chlorine-based gas such as $CCl_4$ or $Cl_2$, bromide-based gas such as HBr, and oxygen gas.

Referring to FIG. 2D, a second insulation layer 26 is formed. The second insulation layer 26 includes a nitride layer such as a silicon nitride layer. The second insulation layer 26 may be formed to have a thickness ranging from approximately 20 Å to approximately 100 Å.

Referring to FIG. 2E, the second insulation layer 26 is selectively etched to expose the bottoms of the second trenches 25. Hereafter, portions of the etched second insulation layer 26, remaining on the sidewalls of the second trenches 25, are referred to as second spacers 26A.

Referring to FIG. 2F, a third insulation layer 27 is formed on the exposed bottom surfaces of the second trenches 25. The third insulation layer 27 includes an oxide layer such as a silicon oxide layer. The third insulation layer 27 may be formed by oxidizing the bottom surfaces of the second trenches 25. The third insulation layer 27 functions as a barrier during a subsequent wet dip process of a polysilicon layer.

Next, a sacrificial layer 28 is formed over the substrate structure including the third insulation layer 27. The sacrificial layer 28 includes a titanium nitride (TiN) layer. The sacrificial layer 28 is formed to have a thickness ranging from approximately 30 Å to approximately 200 Å. The titanium nitride (TiN) layer, which is used as the sacrificial layer 28, has a selectivity with respect to an oxide layer and a nitride layer. Therefore, it is possible to selectively remove the titanium nitride (TiN) layer during the subsequent wet dip process without damaging an oxide layer and a nitride layer.

Referring to FIG. 2G, the sacrificial layer 28 is selectively etched to form third spacers 28A. The third spacers 28A are formed on the sidewalls of the second trenches 25 along the second spacers 26A. The sacrificial layer 28 may be etched back to form the third spacers 28A. The etch-back process may be performed using a mixed gas of chlorine-based gas such as $CCl_4$ or $Cl_2$, bromide-based gas such as HBr, argon (Ar) gas, and oxygen ($O_2$) gas.

With the third spacers 28A, triple layered spacers are formed on both sidewalls of the second trenches 25. The triple layered spacers include the first spacers 24A, the second spacers 26A, and the third spacers 28A. The first spacers 24A are composed of an insulation layer based on an oxide layer, the second spacers 26A are composed of an insulation layer based on a nitride layer, and the third spacers 28A are composed of a titanium nitride layer.

Referring to FIG. 2H, a gap-fill layer 29 gap-filling the inside of the second trenches 25 is formed over the substrate structure including the third spacers 28A. The gap-fill layer 29 includes a polysilicon layer, and it may be removed after a subsequent process.

A one-side contact (OSC) mask 30 is formed over the gap-fill layer 29. The OSC mask 30 has a pattern such that one sidewall of each of the second trenches 25 is not underneath a portion of the OSC mask 30.

Subsequently, the gap-fill layer 29 is partially etched using the OSC mask 30 as an etch barrier. The partial etch process of the gap-fill layer 29 is performed until the upper portion of any one of the third spacers 28A is exposed.

Referring to FIG. 2I, after one of the third spacers 28A is exposed, the OSC mask 30 is removed. Then, the exposed one of the third spacers 28A is removed through a wet dip process.

As a result, a gap 31 is formed in the space from which the third spacer 28A is removed. Because of the gap-fill layer 29, one of the third spacers 28A in each of the second trenches 25 can be removed without removing the other third spacer 28A. Also, the bottom surfaces of the second trenches 25 are protected by the third insulation layer 27.

Referring to FIG. 2J, the gap-fill layer 29 is removed through a wet dip process. As a result, a double layered spacer, including the first and second spacers 24A and 26A, remain on one sidewall of each of the second trenches 25, and a triple layered spacer, including the first to third spacers 24A, 26A and 28A, remain on the other sidewall of each of the second trenches 25.

The third insulation layer 27 protects the bottom of the plurality of the second trenches 25 while the gap-fill layer 29 is removed.

Referring to FIG. 2K, a third trench etch process is performed using the double layered spacers and the triple layered spacers as etch barriers. As a result, a plurality of third trenches 32 are formed. When the third trenches 32 are formed, a portion of the third insulation layer 27 may be etched. The remaining third insulation layer 27 is referred to as a third insulation layer pattern 27A. The third trench etch process may include an anisotropic etch process. When the semiconductor substrate 21 is a silicon substrate, the anisotropic etch process may be performed using a mixed gas of chlorine-based gas such as $CCl_4$ or $Cl_2$, bromide-based gas such as HBr, and oxygen ($O_2$) gas.

As a result of forming the third trenches 32, a plurality of active regions 201 are defined. The active regions 201 are separated from each other by the third trenches 32. Further, the active regions 201 have a structure that may be described as line-type pillars each having two sidewalls. The sidewalls of each active region 201 have a step-type profile due to the first to third trenches 23, 25, and 32.

Referring to FIG. 2L, a fourth insulation layer 33 is formed to cover the surfaces of the semiconductor substrate 21 that are exposed by the third trenches 32. The fourth insulation layer 33 may include a silicon oxide layer that is formed by oxidizing the exposed surfaces of the semiconductor substrate 21, which are exposed by the third trenches 32.

Referring to FIG. 2M, the second spacers 26A of the double layer spacer are removed. As a result, a one-side contact 34 is formed along one sidewall of each of the plurality of active regions 201. To be more specific, a one-side contact 34 is formed at a portion of a sidewall of an active region 201 where the sidewall is not covered by the first spacers 24A, the second spacers 26A, the third spacers 28A, and the fourth insulation layer 33. The portions of the sidewalls of the active regions 201 that are not covered correspond to those portions that were first exposed by the formation of the second trenches 25. Accordingly, by controlling the depth of the second trenches 25, the size of the one-side contacts 34 can be controlled. To form the one-side contact 34, the second spacer 26A may be removed through a cleaning process. Only second spacers 26A along one sidewall in each of the third trenches 32 are removed, because the other second spacers 26A (i.e., the second spacers 26A of the triple layered spacers) are protected by the third spacers 28A.

Since the sidewalls of each second trench 25 correspond to the sidewalls of each active region 201, each one-side contact 34 is formed to selectively expose a portion of one sidewall of each active region 201.

Furthermore, in a subsequent process, a junction is formed in the exposed portion of the sidewall of each active region 201. The junction contacts a buried bit line through the one-side contact 34. Also, although not illustrated in the drawings, instead of a bit line, a contact plug may be coupled with the exposed portion of the sidewall of each active region 201.

The technology of the present invention may form the one-side contact 34 which selectively exposes a portion of any one sidewall of each active region 201. Also, the technology of the present invention allows for improved control of the depth of the one-side contact 34 by performing a triple trench forming process. Therefore, through the triple trench forming process the depth of a junction, which is to be formed subsequently, may also be controlled.

Since the remaining third spacer 28A is a conductive material, such as a titanium nitride layer, the third spacer 28A is removed, which is illustrated in FIG. 2N. Subsequently, a process of forming a buried bit line is performed.

After the third spacer 28A is removed, the sidewalls of each active region 201, except where the one-side contact 34 is formed, are coated with insulation layers. The insulation layers include the first spacer 24A, the second spacer 26A, the third insulation layer pattern 27A, and the fourth insulation layer 33. The first spacer 24A, the third insulation layer pattern 27A, and the fourth insulation layer 33 include an oxide layer, while the second spacer 26A includes a nitride layer.

Figure 3:
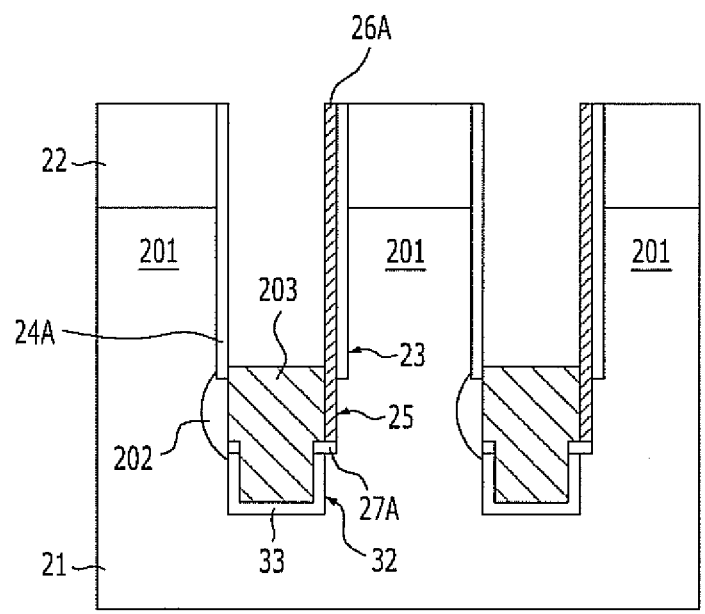
FIG. 3 is a cross-sectional view illustrating a buried bit line in accordance with an exemplary embodiment of the present invention.

FIG. 3 is a cross-sectional view illustrating a buried bit line in accordance with an exemplary embodiment of the present invention.

After the one-side contact 34 is formed by performing the processes illustrated in FIGS. 2A to 2N, a junction 202 is formed on a portion of a sidewall of each active region 201, which is exposed through the one-side contact 34. The junction 202 may be formed through an ion implantation process or a plasma doping process. Also, the junction 202 may be formed by depositing a doped polysilicon layer and performing an annealing process.

Subsequently, a buried bit line 203, which is coupled with the junction 202, is formed. The buried bit line 203 is formed by sequentially forming a barrier metal and a bit line conductive layer, and performing an etch-back process onto the bit line conductive layer and the barrier metal to a height contacting the junction 202. As a result, a buried bit line 203 partially fills each of the third trenches 32. The height of the buried bit line 203 may vary depending on the size and location of the one-side contact 34. Herein, the buried bit line 203 is formed of a metal layer such as a titanium layer or a tungsten layer.

According to the technology of the present invention, a one-side contact may be formed without depositing a polysilicon layer and performing an etch-back process. Therefore, the present invention may improve control of the depth and position of the one-side contact.

Also, since the technology of the present invention uses triple trenches that are extended in a depth direction, it is free from the influence of a seam or void and the number of steps for performing a Chemical Mechanical Polishing (CMP) process, an etch-back process, and a wet-dip process may be decreased. Consequently, the semiconductor device fabrication process may be simplified and the amount of loss of a hard mask pattern may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of first trenches by etching a substrate;

forming first spacers covering both sidewalls of each of the first trenches;

forming a plurality of second trenches by etching a bottom of each of the first trenches;

forming second spacers covering both sidewalls of each of the second trenches;

forming a plurality of third trenches by etching a bottom of each of the second trenches;

forming an insulation layer covering exposed surfaces of the substrate; and forming a contact which exposes one sidewall of each of the second trenches by selectively removing the second spacers.

2. The method of claim 1, wherein the forming of the third trenches comprises:

forming a barrier layer on the bottom surfaces of the second trenches;

forming third spacers along both sidewalls of each of the second trenches to cover the second spacers;

removing one of the third spacers in each of the second trenches; and forming the third trenches by etching the bottom surfaces of the second trenches using the remaining second and third spacers as etch barriers.

3. The method of claim 2, wherein the barrier layer is an oxide layer.

4. The method of claim 2, wherein the barrier layer is formed by oxidizing the bottom surfaces of the second trenches.

5. The method of claim 2, wherein the removing of one of the third spacers comprises:

forming a polysilicon layer which gap-fills insides of the first and second trenches over the third spacers;

exposing an upper portion of one of the third spacers in each of the second trenches by etching a portion of the polysilicon layer;

removing the exposed third spacers; and removing the polysilicon layer.

6. The method of claim 5, wherein the removing of the exposed one of the third spacers and the removing of the polysilicon layer are performed through a wet dip process.

7. The method of claim 2, wherein the third spacers are formed of a titanium nitride layer.

8. The method of claim 1, further comprising:

forming a buried bit line which partially fills insides of the third trenches, after the forming of the contact.

9. The method of claim 1, wherein a hard mask pattern is used as an etch barrier to form the first, second, and third trenches.

10. The method of claim 1, wherein the first spacers and the insulation layer are formed of an oxide layer, and the second spacers are formed of a nitride layer.

11. The method of claim 10, wherein the insulation layer is formed by oxidizing the exposed surfaces of the substrate.

12. A semiconductor device, comprising:

a plurality of triple trenches each including a first trench, a second trench, and a third trench that are formed in a substrate and extend in a depth direction with different widths;

an insulation structure providing a one-side contact, which exposes one sidewall in each of the second trenches, and covering the remaining surfaces of the triple trenches; and a plurality of junctions formed on the sidewalls of the second trenches which are exposed through the one-side contacts, wherein the insulation structure comprises:

a first oxide layer covering both sidewalls of the first trench;

a nitride layer formed over a first oxide layer and covering one sidewall of the second trench; and a second oxide layer covering surfaces of the substrate exposed by the third trench.

13. The semiconductor device of claim 12, further comprising:

a plurality of buried bit lines coupled with the junctions and filling a portion of each of the triple trenches.

14. The semiconductor device of claim 12, wherein the second trench is wider than the third trench, and the first trench is wider than the second trench in each of the triple trenches.

* * * * *